US012799338B2

(12) United States Patent
Zong et al.

(10) Patent No.: US 12,799,338 B2
(45) Date of Patent: Nov. 17, 2026

(54) COMPOSITE COATING, PREPARATION METHOD, AND DEVICE

(71) Applicant: JIANGSU FAVORED NANOTECHNOLOGY CO., LTD., Wuxi (CN)

(72) Inventors: Jian Zong, Wuxi (CN); Siyue Li, Wuxi (CN)

(73) Assignee: JIANGSU FAVORED NANOTECHNOLOGY CO., LTD., Jiangsu (CN)

( * ) Notice: Subject to any disclaimer, the term of this patent is extended or adjusted under 35 U.S.C. 154(b) by 369 days.

(21) Appl. No.: 18/548,343

(22) PCT Filed: Feb. 25, 2022

(86) PCT No.: PCT/CN2022/077853
§ 371 (c)(1),
(2) Date: Aug. 30, 2023

(87) PCT Pub. No.: WO2022/183975
PCT Pub. Date: Sep. 9, 2022

(65) Prior Publication Data

US 2024/0158645 A1 May 16, 2024

(30) Foreign Application Priority Data

Mar. 4, 2021 (CN) ......................... 202110242082.0

(51) Int. Cl.

| | |
|---|---|
| ***C09D 5/08*** | (2006.01) |
| ***C09D 4/00*** | (2006.01) |
| ***C09D 133/06*** | (2006.01) |
| ***C09D 133/16*** | (2006.01) |
| ***C09D 135/02*** | (2006.01) |
| ***C23C 16/505*** | (2006.01) |
| ***C23C 16/515*** | (2006.01) |

(52) U.S. Cl.
CPC ................. *C09D 5/08* (2013.01); *C09D 4/00* (2013.01); *C09D 133/062* (2013.01); *C09D 133/16* (2013.01); *C09D 135/02* (2013.01); *C23C 16/505* (2013.01); *C23C 16/515* (2013.01)

(58) Field of Classification Search
CPC ........ C09D 5/08; C09D 4/00; C09D 133/062; C09D 133/16; C09D 135/02; C23C 16/505; C23C 16/515; C23C 16/50; C23C 16/0272; B05D 1/62; C08F 220/24; C08F 222/102; C08F 220/325
See application file for complete search history.

(56) References Cited

U.S. PATENT DOCUMENTS

2008/0260997 A1* 10/2008 Iwata .................. G02B 5/0278 428/141
2009/0202739 A1 8/2009 O'Neill et al.
2010/0203347 A1 8/2010 Coulson
2018/0171171 A1 6/2018 Coulson et al.
2018/0215955 A1 8/2018 Claret et al.
2020/0032072 A1 1/2020 Coulson et al.
2022/0154032 A1 5/2022 Poulter et al.

FOREIGN PATENT DOCUMENTS

CN 109354903 A 2/2019
CN 109354941 A 2/2019
CN 110158060 A 8/2019
CN 111604234 A 9/2020
CN 111672719 A 9/2020
CN 112980223 A 6/2021
CN 111635655 A 9/2023
EP 2963070 A1 * 1/2016 ............... C09D 4/00
JP 2018527436 A 9/2018

OTHER PUBLICATIONS

Author Unknown, Sigma-Aldrich, 1, 4 Butanediol Dimethacrylate (Year: 2026).*
Author Unknown, ChemSpider, 2-perfluorooctyl ethyl acrylate (Year: 2026).*
Author Unknown, PubChem, 2-(perfluorodecyl) ethyl methacrylate (Year: 2026).*
Author Unknown, Sigma-Aldrich, 1,6-hexanediol dimethacrylate (Year: 2026).*
Author Unknown, Sigma-Aldrich, diethylene glycol dimethacrylate (Year: 2026).*
Author Unknown, Sigma-Aldrich, ethylene glycol dimethacrylate (Year: 2026).*
Author Unknown, Sigma-Aldrich, glycidyl methacrylate, (Year: 2026).*
Author Unknown, Sigma-Aldrich, phenyl methacrylate (Year: 2026).*
Author Unknown, PubChem, Diallyl terephthalate (Year: 2026).*
Office Action issued in Japanese Patent Application No. 2023-553237, dated Nov. 5, 2024.
PCT International Search Report and Written Opinion issued in International Patent Application No. PCT/CN2022/077853, mailed May 13, 2022.
Extended European Search Report issued in European Patent Application No. 22762440.0, dated Jan. 30, 2025.

* cited by examiner

*Primary Examiner* — Nathan L Van Sell
(74) *Attorney, Agent, or Firm* — pH IP Law

(57) ABSTRACT

Specific embodiments of the present disclosure provide a composite coating. In the composite coating, a plasma of a multifunctional-group monomer having an epoxy structure and a plasma of an ester-based coupling agent are used to form a coating as a base coating, and a plasma of an unsaturated ester-based monomer having aromatic ring(s) and a plasma of an ester-based coupling agent are used to form a coating as an anti-corrosion coating. The composite coating has a high binding force with a substrate and a strong corrosion resistance.

20 Claims, 1 Drawing Sheet

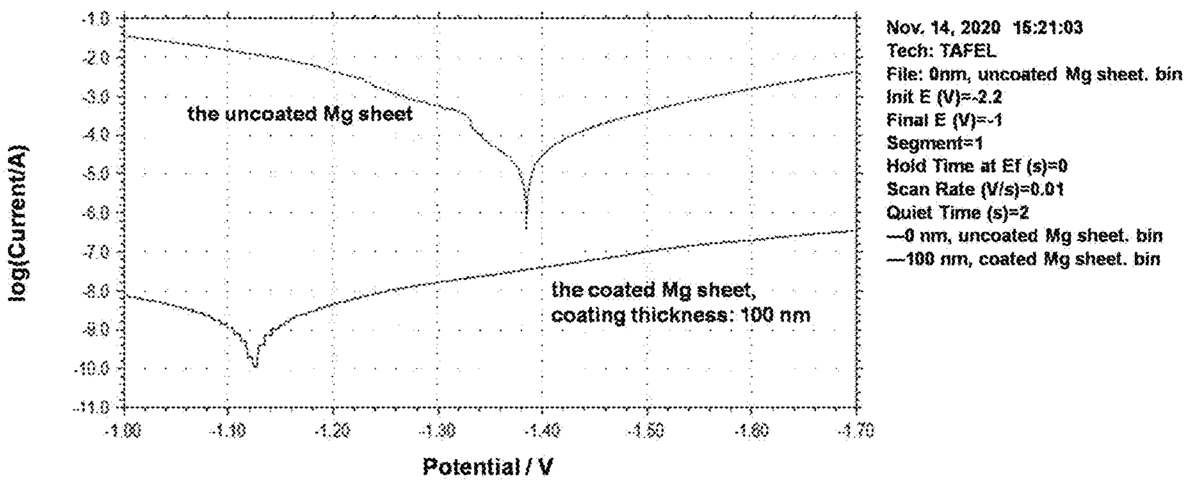
log(Current/A)
-1.0
-2.0
-3.0
-4.0
-5.0
-6.0
-7.0
-8.0
-9.0
-10.0
-11.0
the uncoated Mg sheet
the coated Mg sheet,
coating thickness: 100 nm
-1.00
-1.10
-1.20
-1.30
-1.40
-1.50
-1.60
-1.70
Potential / V
Nov. 14, 2020 15:21:03
Tech: TAFEL
File: 0nm, uncoated Mg sheet. bin
Init E (V)=-2.2
Final E (V)=-1
Segment=1
Hold Time at Ef (s)=0
Scan Rate (V/s)=0.01
Quiet Time (s)=2
—0 nm, uncoated Mg sheet. bin
—100 nm, coated Mg sheet. bin

COMPOSITE COATING, PREPARATION METHOD, AND DEVICE

CROSS-REFERENCE TO RELATED APPLICATIONS

This application is a U.S. National Stage application under 35 U.S.C. § 371 of International Application No. PCT/CN2022/077853, filed on Feb. 25, 2022, which claims the benefit of priority to Chinese Patent Application No. 202110242082.0, filed on Mar. 4, 2021, and entitled "COMPOSITE COATING, PREPARATION METHOD, AND DEVICE", the contents of which are incorporated herein by reference in their entireties.

TECHNICAL FIELD

The present disclosure relates to the field of plasma chemistry, and more particularly, to a plasma polymerization composite coating and a preparation method to thereof.

BACKGROUND

Electronic or electrical devices and assemblies, metal products and other various products are very sensitive to damages caused by contamination of liquids, especially contamination of water. For example, when electronic or electrical devices are in normal use or accidentally exposed to liquids, it may cause a short circuit between electronic components and cause irreparable damage to circuit boards, electronic chips and other products. Organic polymer coatings can effectively protect surfaces of different materials. Among methods for preparing organic polymer coatings, vapor deposition method is a mainstream method for preparing polymer protective coatings on surfaces of substrates. The vapor deposition method is economically practical and easy to operate. Particularly, in a plasma chemical vapor deposition, plasmas are used to activate reaction monomer gases to deposit on surfaces of substrates, and the plasma chemical vapor deposition is applicable for various substrates. In addition, the deposited polymer protective coatings are uniform, ultra-thin, transparent, insulating and anti-aging, and the deposited polymer protective coatings can selectively protect electronic components, especially printed circuit boards. Currently, plasma protective coatings have some disadvantages, such as poor binding force with substrates, prone to peeling, and unstable corrosion resistance.

SUMMARY

Specific embodiments of the present disclosure provide a composite coating having a high binding force and a strong corrosion resistance, a preparation method and a device. Details are as follows.

A composite coating is provided, and the composite coating includes a coating I and a coating II deposited on a substrate.

The coating I is a plasma polymerization coating formed from plasmas including a monomer α and a monomer β.

The coating II is a plasma polymerization coating formed on the coating I by contacting the coating I with plasmas including a monomer γ and a monomer δ.

A structure of the monomer α is shown as in formula (1-1),

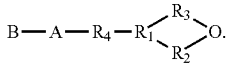

(1-1)

In the formula (1-1), $R_1$ is selected from CH or a $C_3$-$C_8$ cycloalkyl. $R_2$, $R_3$ and $R_4$ are respectively independently selected from a connecting bond or a $C_1$-$C_6$ alkylene, $R_2$ and $R_3$ are not connected to a same carbon atom when $R_2$ and $R_3$ are both connecting bonds, A is a connecting part, and B includes a carbon-carbon unsaturated bond or an epoxy structure.

A structure of the monomer β is shown as in formula (2-1),

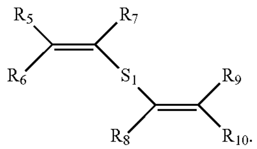

(2-1)

In the formula (2-1), $S_1$ includes at least one —O—C(O)— or —C(O)—O—, and $R_5$, $R_6$, $R_7$, $R_8$, $R_9$ and $R_{10}$ are respectively independently selected from a group consisting of a hydrogen atom, a halogen atom, a $C_1$-$C_{10}$ alkyl and a halogen-substituted $C_1$-$C_{10}$ alkyl.

A structure of the monomer γ is shown as in formula (3-1),

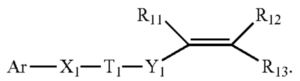

(3-1)

In the formula (3-1), Ar is a structure with aromatic ring(s), $T_1$ is —O—C(O)— or —C(O)—O—. $X_1$ is a connecting part, $Y_1$ is a connecting part, and $R_{11}$, $R_{12}$ and $R_{13}$ are respectively independently selected from a group consisting of a hydrogen atom, a halogen atom, a $C_1$-$C_{10}$ alkyl and a halogen-substituted $C_1$-$C_{10}$ alkyl.

A structure of the monomer δ is shown as in formula (4-1),

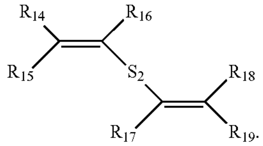

(4-1)

In the formula (4-1), $S_2$ includes at least one —O—C(O)— or —C(O)—O—, and $R_{14}$, $R_{15}$, $R_{16}$, $R_{17}$, $R_{18}$ and $R_{19}$ are respectively independently selected from a group consisting of a hydrogen atom, a halogen atom, a $C_1$-$C_{10}$ alkyl and a halogen-substituted $C_1$-$C_{10}$ alkyl.

Optionally, the A is —O—C(O)— or —C(O)—O—.

Optionally, a structure of the monomer α is shown as in formula (1-2), (1-2)

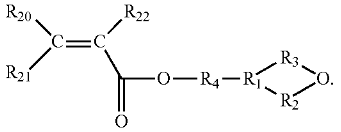

In the formula (1-2), $R_{20}$, $R_{21}$ and $R_{22}$ are respectively independently selected from a group consisting of a hydrogen atom, a halogen atom, a $C_1$-$C_{10}$ alkyl and a halogen-substituted $C_1$-$C_{10}$ alkyl.

Optionally, the $R_5$, $R_6$, $R_7$, $R_8$, $R_9$, $R_{10}$, $R_{11}$, $R_{12}$, $R_{13}$, $R_{14}$, $R_{15}$, $R_{16}$, $R_{17}$, $R_{18}$ and $R_{19}$ are respectively independently selected from a group consisting of a hydrogen atom and a methyl.

Optionally, the $R_{20}$, $R_{21}$ and $R_{22}$ are respectively independently selected from a group consisting of a hydrogen atom and a methyl.

Optionally, the monomer α includes one or more selected from a group consisting of: glycidyl methacrylate, tetrahydrofurfuryl acrylate, 3,4-epoxycyclohexylmethyl-3,4-epoxycyclohexylcarboxylate, 3,4-epoxycyclohexylmethacrylate, 3,4-epoxycyclohexylmethylmethacrylate, 1,2-epoxy-4-vinylcyclohexane, bis (2,3-epoxycyclopentyl) ether, 2,3-epoxycyclopentylcyclopentyl ether, vinylcyclohexene diepoxide, diisoprene diepoxide and bis ((3,4-epoxycyclohexyl) methyl) adipate.

Optionally, the $S_1$ and/or $S_2$ include(s) two —O—C(O)— or —C(O)—O—.

Optionally, a structure of the $S_1$ is shown as in formula (2-2), (2-2)

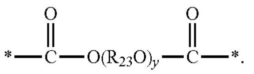

In the formula (2-2), $R_{23}$ is a $C_2$-$C_{10}$ alkylene or a halogen-substituted $C_2$-$C_{10}$ alkylene, and y is an integer ranging from 0 to 10.

Optionally, the monomer β includes at least one selected from a group consisting of: 1,4-butanediol dimethacrylate, 1,6-hexanediol dimethacrylate, ethylene glycol dimethacrylate, diethylene glycol dimethacrylate, triethylene glycol dimethacrylate, tetraethylene glycol dimethacrylate, 1,3-butanediol dimethacrylate, neopentyl glycol dimethacrylate, methacrylic anhydride, diprop-2-enyl-2-methylene succinate, diprop-2-enyl 2-benzylidene malonate, and diethyl diallyl malonate.

Optionally, a structure of the $X_1$ is shown as in formula (3-2), $$*—X_{11}—X_{12}—* \quad (3-2).$$

In the formula (3-2), $X_{11}$ is a connecting bond. —O— or —C(O)—, and $X_{12}$ is a connecting bond, a $C_1$-$C_{10}$ alkylene or a halogen-substituted $C_1$-$C_{10}$ alkylene.

The $Y_1$ is a connecting bond, a $C_1$-$C_{10}$ alkylene or a halogen-substituted $C_1$-$C_{10}$ alkylene.

Optionally, the Ar is a benzene ring structure or a benzene ring structure with substituent(s).

Optionally, a structure of the monomer γ is shown as in formula (3-3), (3-3)

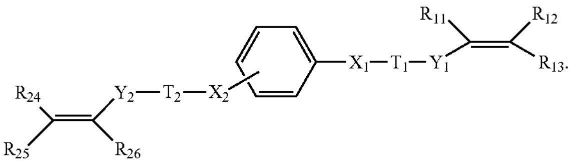

In the formula (3-3). $T_2$ is —O—C(O)— or —C(O)—O—, $X_2$ is a connecting part, and $Y_2$ is a connecting part. $R_{24}$, $R_{25}$ and $R_{26}$, are respectively independently selected from a group consisting of a hydrogen atom, a halogen atom, a $C_1$-$C_{10}$ alkyl and a halogen-substituted $C_1$-$C_{10}$ alkyl.

Optionally, a structure of the $X_2$ is shown as in formula (3-4), $$*—X_{22}—X_{21}—* \quad (3-4).$$

In the formula (3-4), $X_{21}$ is a connecting bond, —O— or —C(O)—, and $X_2$ is a connecting bond, a $C_1$-$C_{10}$ alkylene or a halogen-substituted $C_1$-$C_{10}$ alkylene.

The $Y_2$ is a connecting bond, a $C_1$-$C_{10}$ alkylene or a halogen-substituted $C_1$-$C_{10}$ alkylene.

Optionally, the $R_{24}$, $R_{25}$ and $R_{26}$ are respectively independently selected from a group consisting of a hydrogen atom and a methyl.

Optionally, the monomer γ includes at least one selected from a group consisting of: 2-phenoxyethyl acrylate, phenyl acrylate, diallyl terephthalate and phenyl methacrylate.

Optionally, a structure of the $S_2$ is shown as in formula (4-2), (4-2)

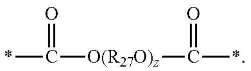

In the formula (4-2), $R_{27}$ is a $C_2$-$C_{10}$ alkylene or a halogen-substituted $C_2$-$C_{10}$ alkylene, and z is an integer ranging from 0 to 10.

Optionally, the monomer δ includes at least one selected from a group consisting of: 1,4-butanediol dimethacrylate, 1,6-hexanediol dimethacrylate, ethylene glycol dimethacrylate, diethylene glycol dimethacrylate, triethylene glycol dimethacrylate, tetraethylene glycol dimethacrylate, 1,3-butanediol dimethacrylate, neopentyl glycol dimethacrylate, methacrylic anhydride, dipropyl-2-allyl-2-methylene succinate, diprop-2-enyl 2-benzylidene malonate, and diethyl diallyl malonate.

Optionally, the composite coating also includes a coating III. The coating III is a plasma polymerization coating formed on the coating II by contacting the coating II with plasmas including a monomer ε.

A structure of the monomer E is shown as in formula (5-1), (5-1)

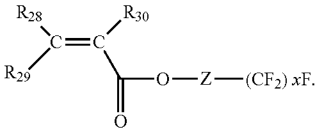

In the formula (5-1), Z is a connecting part, $R_{28}$, $R_{29}$ and $R_{30}$ are respectively independently selected from a group consisting of a hydrogen atom, a halogen atom, a $C_1$-$C_{10}$ hydrocarbyl and a halogen-substituted $C_1$-$C_{10}$ hydrocarbyl, and x is an integer is ranging from 1 to 20.

Optionally, the Z is a connecting bond, a $C_1$-$C_4$ alkylene or a $C_1$-$C_4$ alkylene with substituent(s), and x is an integer greater than or equal to 5.

Optionally, the $R_{28}$, $R_{29}$ and $R_{30}$ are respectively independently selected from a group consisting of a hydrogen atom and a methyl.

Optionally, the monomer ε includes one or more selected from a group consisting of: 3-(perfluoro-5-methylhexyl)-2-hydroxypropyl methacrylate, 2-(perfluorodecyl) ethyl methacrylate, 2-(perfluorohexyl) ethyl methacrylate, 2-(perfluorododecyl) ethyl acrylate, 2-perfluorooctyl ethyl acrylate, 1H,1H,2H,2H-perfluorooctyl acrylate, 2-(perfluorobutyl) ethyl acrylate, (2H-perfluoropropyl)-2-acrylate, and (perfluorocyclohexyl) methacrylate.

Optionally, a thickness of the composite coating ranges from 50 nm to 300 nm.

Optionally, a molar ratio of the monomer α and the monomer β ranges from 1:5 to 5:1.

Optionally, a molar ratio of the monomer γ and the monomer δ ranges from 3:10 to 10:3.

Optionally, the substrate is a metal, a plastic, a fabric, a glass, an electrical assembly, an optical instrument or an electrical component.

A preparation method of any one of the above composite coatings is provided. The preparation method includes:

- providing a substrate, placing the substrate in a plasma reaction chamber, vacuumizing the plasma reaction chamber to get a vacuum degree in the plasma reaction chamber ranging from 20 mTorr to 200 mTorr, and introducing one or more gases selected from a group consisting of: inert gas He, inert gas Ar, and $O_2$;
- introducing mixed vapors including the monomer α and the monomer β into the plasma reaction chamber, and turning on a plasma discharge to form a plasma polymerization coating L; and
- introducing mixed vapors including the monomer γ and the monomer δ into the plasma reaction chamber, and turning on a plasma discharge to form a plasma polymerization coating II on the coating I.

Optionally, introducing a vapor of the monomer ε into the plasma reaction chamber, and turning on a plasma discharge to form a plasma polymerization coating III on the coating II.

Optionally, the plasma is a pulse plasma.

Optionally, the pulse plasma is generated by applylng a pulse voltage discharge, wherein a pulse power ranges from 50 W to 500 W, a pulse frequency ranges from 25 Hz to 85 kHz, a pulse duty cycle ranges from 5% to 85%, and a plasma discharge duration time ranges from 100 s to 36000 s.

A device is provided. At least a part of a surface of the device is provided with any one of the above composite coatings.

According to some embodiments of the present disclosure, a plasma of a multifunctional-group monomer having an epoxy structure and a plasma of an ester-based coupling agent are used to form a coating as a base coating, and a plasma of an unsaturated ester-based monomer having aromatic ring(s) and a plasma of an ester-based coupling agent are used to form a coating as an anti-corrosion coating. The base coating is conducive to a close combination of the substrate and the anti-corrosion coating and improving a compactness of the composite coating. In the anti-corrosion coating the aromatic ring(s) has a good stability, which can provide the polymer with a relatively good hardness, a relatively good heat resistance, a relatively good temperature resistance, an improved hydrophobicity, and a decreased water solubility. Ester groups are provided in the anti-corrosion coating to form hydrogen bonds, resulting in a relatively good adhesion. Therefore, the composite coating being of a very thin thickness has an excellent protective performance. Further, a multifunctional-group monomer having an epoxy structure uses a multifunctional-group ester having an epoxy structure, particularly an acrylate having an epoxy structure, leading to an even better protective performance of the entire composite coating. Further, a fluorine-containing hydrophobic coating is formed on the anti-corrosion coating, and may further improve the protective performance of the composite coating.

BRIEF DESCRIPTION OF THE DRAWINGS

FIG. 1 schematically illustrates a Tafel curve obtained from an electrochemical test for a coated Mg sheet and an uncoated Mg sheet in Embodiment 3.

DETAILED DESCRIPTION

According to some embodiments of the present disclosure, a composite coating includes a coating I and a coating II deposited on a substrate.

The coating I is a plasma polymerization coating formed from plasmas including a monomer α and a monomer β.

The coating II is a plasma polymerization coating formed on the coating I by contacting the coating I with plasmas including a monomer γ and a monomer δ.

A structure of the monomer α is shown as in formula (1-1), (1-1)

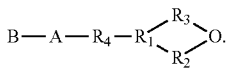

In the formula (1-1), $R_1$ is selected from CH or a $C_3$-$C_8$ cycloalkyl, $R_2$, $R_3$ and $R_4$ are respectively independently selected from a connecting bond or a $C_1$-$C_6$ alkylene, and $R_2$ and $R_3$ are not connected to a same carbon atom when $R_2$ and $R_3$ are both connecting bonds, A is a connecting part, and B includes a carbon-carbon unsaturated bond or an epoxy structure.

A structure of the monomer β is shown as in formula (2-1), (2-1)

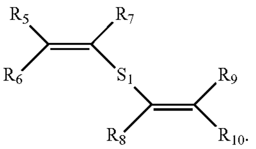

In the formula (2-1), $S_1$ includes at least one —O—C(O)— or —C(O)—O—, and $R_5$, $R_6$, $R_7$, $R_8$, $R_9$ and $R_{10}$ are respectively independently selected from a group consisting of a hydrogen atom, a halogen atom, a $C_1$-$C_{10}$ alkyl and a halogen-substituted $C_1$-$C_{10}$ alkyl.

A structure of the monomer γ is shown as in formula (3-1), (3-1)

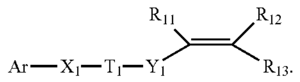

In the formula (3-1), Ar is a structure with aromatic ring(s), $T_1$ is —O—C(O)— or —C(O)—O—. $X_1$ is a connecting part, $Y_1$ is a connecting part, and $R_{11}$, $R_{12}$ and $R_{13}$ are respectively independently selected from a group consisting of a hydrogen atom, a halogen atom, a $C_1$-$C_{10}$ alkyl and a halogen-substituted $C_1$-$C_{10}$ alkyl.

A structure of the monomer δ is shown as in formula 4-1), (4-1)

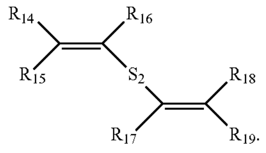

In the formula (4-1), $S_2$ includes at least one —O—C(O)— or —C(O)—O—, and $R_{14}$, $R_{15}$, $R_{16}$, $R_{17}$, $R_{18}$ and $R_{19}$ are respectively independently selected from a group consisting of a hydrogen atom, a halogen atom, a $C_1$-$C_{10}$ alkyl and a halogen-substituted $C_1$-$C_{10}$ alkyl.

According to some embodiments of the present disclosure, $R_2$ and $R_3$ are not connected to a same carbon atom when $R_2$ and $R_3$ are both connecting bonds. Specifically, when $R_1$ is CH, at least one of $R_2$ and $R_3$ is not a connecting bond. When $R_1$ is a cycloalkyl, $R_2$ and $R_3$ share two carbon atoms with $R_1$. Or, when $R_2$ and $R_3$ share a carbon atom with $R_1$, at least one of $R_2$ and $R_3$ is not a connecting bond.

According to some embodiments of the present disclosure, the coating I is formed on the substrate by performing a plasma chemical vapor deposition of the multifunctional-group monomer α having an epoxy structure as shown in the formula (1-1) and the ester-based coupling agent monomer β as shown in the formula (1-2), so that the substrate having the composite coating may be tightly combined with an anti-corrosion coating. The coating II is formed on the coating I by performing a plasma chemical vapor deposition of the unsaturated ester-based monomer γ having aromatic ring(s) as shown in the formula (1-3) and an ester-based coupling agent monomer δ as shown in the formula (1-4). The aromatic ring has a good stability, which can provide the polymer coating with a relatively good hardness, a relatively good heat resistance, a relatively good temperature resistance, an improved hydrophobicity, and a decreased water solubility. Ester groups are provided in the coating II to cooperate with ester bonds of the coating 1 to form hydrogen bonds, resulting in a good adhesion. Therefore, the composite coating being of a very thin thickness has an excellent is protective performance.

According to some embodiments of the present disclosure, the $R_5$, $R_6$, $R_7$, $R_8$, $R_9$, $R_{10}$, $R_{11}$, $R_{12}$, $R_{13}$, $R_{14}$, $R_{15}$, $R_{16}$, $R_{17}$, $R_{18}$ and $R_{19}$ are respectively independently selected from a group consisting of a hydrogen atom and a methyl.

According to some embodiments of the present disclosure, $R_1$ is selected from a $C_3$-$C_8$ cycloalkyl, such as a cyclopentyl or a cyclohexyl, and the $R_2$ and the $R_3$ share two carbon atoms with $R_1$. The $R_2$, $R_3$ and $R_4$ are respectively independently selected from a connecting bond or a $C_1$-$C_6$ alkylene. The alkylene includes a linear alkylene, such as methylene, ethylene, propylene, or butylene. Or the alkylene includes a branched alkylene, such as isopropylene or isobutylene.

According to some embodiments of the present disclosure, in the formula (1-1), B is a carbon-carbon unsaturated double bond, a carbon-carbon unsaturated triple bond or an epoxy structure, and the epoxy structure is conductive to forming a dense coating. According to some embodiments, the A is —O—C(O)— or —C(O)—O—. Further, a structure of the monomer α is shown as in formula (1-2), (1-2)

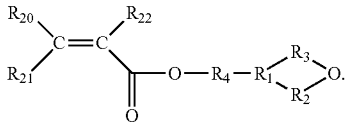

In the formula (1-2), $R_{20}$, $R_{21}$ and $R_{22}$ are respectively independently selected from a group consisting of a hydrogen atom, a halogen atom, a $C_1$-$C_{10}$ alkyl and a halogen-substituted $C_1$-$C_{10}$ alkyl. The composite coating formed from the monomer α having this structure has a relatively good protective performance. According to some embodiments, the $R_{20}$, $R_{21}$ and $R_{22}$ are respectively independently selected from a group consisting of a hydrogen atom and a methyl. The alkyl includes is a linear alkyl, such as methyl, ethyl, propyl, or butyl. Or the alkyl includes a branched alkyl, such as isopropyl or isobutyl.

According to some embodiments of the present disclosure, the monomer α includes one or more selected from a group consisting of: glycidyl methacrylate (CAS number: 106-91-2), tetrahydrofurfuryl acrylate (CAS number: 2399-48-6), 3,4-epoxycyclohexylmethyl-3,4-epoxylcyclohexylcarboxylate (CAS number: 2386-87-0), 3,4-epoxycyclohexylmethacrylate (CAS number: 64630-63-3), 3,4-epoxycyclohexylmethylmethacrylate (CAS number: 82428-30-6), 1,2-epoxy-4-vinylcyclohexane (CAS number: 106-86-5), bis (2,3-epoxycyclopentyl) ether (CAS number: 2386-90-5), 2,3-epoxycyclopentylcyclopentyl ether, vinylcyclohexene diepoxide (CAS number: 106-87-6), diisoprene diepoxide and bis ((3,4-epoxycyclohexyl) methyl) adipate (CAS number: 3130-19-6).

According to some embodiments of the present disclosure, the $S_1$, includes two —O—C(O)— or —C(O)—O—. That is, the $S_1$ includes two —O—C(O)—, or the $S_1$, includes to two —C(O)—O—, or the $S_1$ includes a —O—C(O)— and a —C(O)—O—.

According to some embodiments of the present disclosure, a structure of the $S_1$ is shown as in formula (2-2), (2-2)

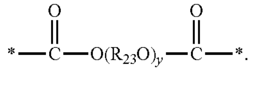

In the formula (2-2), $R_{23}$ is a $C_2$-$C_{10}$ alkylene or a halogen-substituted $C_2$-$C_{10}$ alkylene, the alkylene includes a linear alkylene, such as methylene, ethylene, propylene, or butylene. Or the alkylene includes a branched alkylene, such as isopropylene or isobutylene. In the formula (2-2), y is an integer ranging from 0 to 10, and specifically, y is 0, 1, 2, 3, 4, 5, 6, 7, 8, 9, or 10.

According to some embodiments of the present disclosure, as a specific non-limiting example, the monomer β includes at least one selected from a group consisting of: 1,4-butanediol dimethacrylate (CAS number: 2082-81-7), 1,6-hexanediol dimethacrylate (CAS number: 6606-59-3), ethylene glycol dimethacrylate (CAS number: 97-90-5), diethylene glycol dimethacrylate (CAS number: 2358-84-1), triethylene glycol dimethacrylate (CAS number: 109-16-0), tetraethylene glycol dimethacrylate (CAS number: 109-17-1), 1,3-butanediol dimethacrylate (CAS number: 1189-08-8), neopentyl glycol dimethacrylate (CAS number: 1985-51-9), methacrylic anhydride (CAS number: 760-93-0), diprop-2-enyl-2-methylene succinate, diprop-2-enyl 2-benzylidene malonate (CAS number: 52505-39-2), and diethyl diallyl malonate (CAS number: 3195-24-2).

According to some embodiments, the Ar is a benzene ring with substituent(s) on the aromatic ring or a heteroaromatic ring with substituent(s) on the aromatic ring(s). According to some embodiments, the Ar is a benzene ring without substituent(s) on the aromatic ring or a heteroaromatic ring without substituent(s) on the aromatic ring(s).

According to some embodiments of the present disclosure, $X_1$ is a connecting part, and $Y_1$ is a connecting part. $X_1$ is used to connect Ar having aromatic ring(s) with the ester bond $T_1$, and $Y_1$ is used to connect the ester bond $T_1$ with the carbon-carbon unsaturated double bond. According to some embodiments, a structure of the $X_1$ is shown as in the formula (3-2) below, $$*-X_{11}-X_{12}-* \quad (3\text{-}2).$$

In the formula (3-2), $X_{11}$ is a connecting bond, —O— or —C(O)—, and $X_{12}$ is a connecting bond, a $C_1$-$C_{10}$ alkylene or a halogen-substituted $C_1$-$C_{10}$ alkylene. The $Y_1$ is a connecting bond, a $C_1$-$C_{10}$ alkylene or a halogen-substituted $C_1$-$C_{10}$ alkylene. The alkylene includes a linear alkylene, such as methylene, ethylene, propylene, or butylene. Or the alkylene includes a branched alkylene, such as isopropylene or isobutylene.

According to some embodiments of the present disclosure, a structure of the monomer γ is shown as in formula (3-3), (3-3)

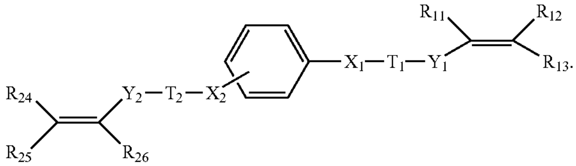

In the formula (3-3). $T_2$ is —O—C(O)— or —C(O)—O—. $X_2$ is a connecting part used to connect the benzene ring with the ester bond $T_2$, and $Y_2$ is a connecting part used to connect the ester bond $T_2$ with the carbon-carbon double bond.

$R_{24}$, $R_{25}$ and $R_{26}$ are respectively independently selected from a group consisting of a hydrogen atom, a halogen atom, a $C_1$-$C_{10}$ alkyl and a halogen-substituted $C_1$-$C_{10}$ alkyl. The alkyl includes a linear alkyl, such as methyl, ethyl, propyl, or butyl. Or the alkyl includes a branched alkyl, such as isopropyl or isobutyl.

According to some embodiments of the present disclosure, in the structure shown in the formula (3-3), two substituents on the benzene ring may be para-substituents, and in other embodiments, two substituents may be ortho-substituents or meta-substituents.

According to some embodiments of the present disclosure, a structure of the $X_2$ is shown as in the formula (3-4) below, $$*-X_{22}-X_{21}-* \quad (3\text{-}4).$$

In the formula (3-4), $X_{21}$ is a connecting bond, —O— or —C(O)—, and $X_{22}$ is a connecting bond, a $C_1$-$C_{10}$ alkylene or a halogen-substituted $C_1$-$C_{10}$ alkylene. The $Y_2$ is a connecting bond, a $C_1$-$C_{10}$ alkylene or a halogen-substituted $C_1$-$C_{10}$ alkylene. The alkylene includes a linear alkylene, such as methylene, ethylene, propylene, or to butylene. Or the alkylene includes a branched alkylene, such as isopropylene or isobutylene.

According to some embodiments of the present disclosure, the $R_{24}$, $R_{25}$ and $R_{26}$ are respectively independently selected from a group consisting of a hydrogen atom and a methyl.

According to some embodiments of the present disclosure, as a specific non-limiting example, the monomer γ includes at least one selected from a group consisting of: 2-phenoxyethyl acrylate (CAS number: 48145-04-6), phenyl acrylate (CAS number: 937-41-7), diallyl terephthalate (CAS number: 1026-92-2) and phenyl methacrylate (CAS number: 2177-70-0).

According to some embodiments of the present disclosure, the $S_2$ includes two —O—C(O)— or —C(O)—O—. That is. $S_2$ includes two —O—C(O)—, or $S_2$ includes two —C(O)—O—, or $S_2$ includes a —O—C(O)— and a —C(O)—O—.

According to some embodiments of the present disclosure, a structure of the $S_2$ is shown as in formula (4-2), (4-2)

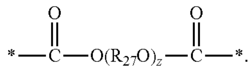

In the formula (4-2), $R_{27}$ is a $C_2$-$C_{10}$ alkylene or a halogen-substituted $C_2$-$C_{10}$ alkylene. The alkylene includes a linear alkylene, such as methylene, ethylene, propylene, or butylene. Or the alkylene includes a branched alkylene, such as isopropylene or isobutylene. In the formula (4-2), z is an integer ranging from 0 to 10, and specifically, z is 0, 1, 2, 3, 4, 5, 6, 7, 8, 9, or 10.

According to some embodiments of the present disclosure, as a specific non-limiting example, the monomer δ includes at least one selected from a group consisting of: 1,4-butanediol dimethacrylate, 1,6-hexanediol dimethacrylate, ethylene glycol dimethacrylate, diethylene glycol dimethacrylate, triethylene glycol dimethacrylate, tetraethylene glycol dimethacrylate, 1,3-butanediol dimethacrylate, neopentyl glycol dimethacrylate, methacrylic anhydride, dipropyl-2-allyl-2-methylene succinate, diprop-2-enyl 2-benzylidene malonate, and diethyl diallyl malonate.

According to some embodiments of the present disclosure, the composite coating also includes a coating III. The coating III is a plasma polymerization coating formed on the coating II by contacting the coating II with plasmas including a monomer c. A structure of the monomer F is shown as in formula (5-1), (5-1)

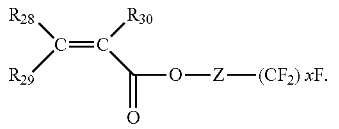

In the formula (5-1), Z is a connecting part, $R_{28}$, $R_{29}$ and $R_{30}$ are respectively independently selected from a group consisting of a hydrogen atom, a halogen atom, a $C_1$-$C_{10}$ hydrocarbyl and a halogen-substituted $C_1$-$C_{10}$ hydrocarbyl, and x is an integer ranging from 1 to 20.

According to some embodiments of the present disclosure, the Z is a connecting part used to connect an ester bond with a perfluorocarbon alkyl. According to some embodiments, the Z is a connecting bond, a $C_1$-$C_4$ alkylene or a $C_1$-$C_4$ alkylene with substituent(s). The alkylene includes a linear alkylene, such as methylene, ethylene, propylene, or butylene. Or the alkylene includes a branched alkylene, such as isopropylene or isobutylene. The substituent(s) include(s): a halogen atom, a hydrocarbyl, a carboxyl, or an ester group, etc.

According to some embodiments of the present disclosure, the x is an integer greater than or equal to 4, and further the x is an integer greater than or equal to 6. Specifically, the x is such as 6, 7, 8, 9, 10, 11, 12, 13, 14, 15, 16, 17, 18, 19 or 20, and is beneficial for improving a hydrophobicity performance of the coating.

According to some embodiments of the present disclosure, as a specific non-limiting example, the monomer c includes one or more selected from a group consisting of: 3-(perfluoro-5-methylhexyl)-2-hydroxypropyl methacrylate (CAS number: 16083-81-1), 2-(perfluorodecyl) ethyl methacrylate (CAS number: 2144-54-9), 2-(perfluorohexyl) ethyl methacrylate (CAS number: 2144-53-8), 2-(perfluorododecyl) ethyl acrylate (CAS number: 34395-24-9), 2-perfluorooctyl ethyl acrylate (CAS number: 27905-45-9), 1H,1H,2H,2H-perfluorooctyl acrylate (CAS number: 17527-29-6), 2-(perfluorobutyl) ethyl acrylate (CAS number: 52591-27-2), (2H-perfluoropropyl)-2-acrylate (CAS number: 59158-81-5), and (perfluorocyclohexyl) methacrylate (CAS number: 40677-94-9).

According to some embodiments of the present disclosure, the coating I is a plasma polymerization coating formed from plasmas including the monomer α and the monomer β. The coating ID is a plasma polymerization coating formed on the coating I by contacting the coating I with plasmas including the monomer γ and the is monomer δ. The coating III is a plasma polymerization coating formed on the coating II by contacting the coating II with a plasma of the monomer c. According to some embodiments, without affecting the overall performance of the coating I, the coating II, or the coating II, the coating I may be a plasma polymerization coating formed from plasmas including the monomer α, the monomer 1 and other suitable monomer(s). The coating II may be a plasma polymerization coating formed on the coating I by contacting the coating I with plasmas including the monomer γ, the monomer δ and other suitable monomer(s). The coating III may be a plasma polymerization coating formed on the coating II by contacting the coating 11 with plasmas including the monomer F and other suitable monomer(s).

According to some embodiments of the present disclosure, a thickness of the composite coating ranges from 50 nm to 500 nm. The composite coating can still maintain an excellent protective performance though having such an ultra-thin thickness. According to some embodiments, the substrate is a metal, and a thickness of the composite coating ranges from 80 nm to 150 nm, and specifically may be, for example, 80 nm, 90 nm, 100 nm, 110 nm, 120 nm, 130 nm, 140 nm, or 150 nm, and so on. According to some embodiments, the substrate is a circuit board, and a thickness of the composite coating ranges from 200 nm to 300 nm, and specifically may be, for example, 200 nm, 210 nm, 220 nm, 230 nm, 240 nm, 250 nm, 260 nm, 270 nm, 280 nm, 290 nm or 300 nm, and so on.

According to some embodiments of the present disclosure, a molar ratio of the monomer α and the monomer β ranges from 1:5 to 5:1, and specifically may be is such as 1:5, 1:4, 1:3, 1:2.5, 1:2, 1:1.5, 1:1, 1.5:1, 2:1, 2.5:1, 3:1, 4:1 or 5:1. According to some other embodiments, the molar ratio of the monomer α and the monomer β can also be adjusted between other ratios depending on specific monomers situations and specific product protection requirements.

According to some embodiments of the present disclosure, a molar ratio of the monomer γ and the monomer β ranges from 3:10 to 10:3, and specifically may be such as 3:10, 4:10, 5:10, 6:10, 7:10, 8:10, 9:10, 10:10, 10:9, 10:8, 10:7, 10:6, 10:5, 10:4 or 10:3. According to some other embodiments, the molar ratio of the monomer γ and the monomer δ can also be adjusted between other ratios depending on specific monomers situations and specific product protection requirements.

According to some embodiments of the present disclosure, the substrate is a metal, such as iron, magnesium, aluminum, copper or alloy(s) thereof. According to some other embodiments, the substrate is various plastics, fabrics, glass, electrical assemblies, or optical instruments, and so on. Specifically, the electrical assemblies may be printed circuit boards (PCBs), electronic products, or electronic assembly semi-finished products. When the substrate is an electronic product, the electronic product may be, for example, but is not limited to, a mobile phone, a tablet, a keyboard, an electronic reader, a wearable device, a display, and so on. The substrate may also be any suitable electrical component of an electrical assembly, and specifically, the electrical component may be a resistor, a capacitor, a transistor, a diode, an amplifier, a relay, a transformer, a battery, a fuse, an integrated circuit, a switch, an LED, an LED display, a piezoelectric component, an optoelectronic is component, an antenna or an oscillator, and so on.

According to some embodiments of the present disclosure, a preparation method of any one of the above composite coatings is provided. The preparation method includes:

- providing a substrate, placing the substrate in a plasma reaction chamber, vacuumizing the plasma reaction chamber to get a vacuum degree in the plasma reaction chamber ranging from 20 mTorr to 200 mTorr, and introducing one or more gases selected from a group consisting of: inert gas He, inert gas Ar, and $O_2$;
- introducing mixed vapors including the monomer α and the monomer β into the plasma reaction chamber, and turning on a plasma discharge to form a plasma polymerization coating L; and
- introducing mixed vapors including the monomer γ and the monomer δ into the plasma reaction chamber, and turning on a plasma discharge to form a plasma polymerization coating II on the coating I.

According to some embodiments of the present disclosure, the preparation method also includes: introducing a vapor of the monomer ε into the plasma reaction chamber, and turning on a plasma discharge to form a plasma polymerization coating III on the coating II.

According to some embodiments of the present disclosure, the monomer α, the monomer β, the monomer γ, the monomer δ, the monomer ε, the coating I, the coating II, the coating II and the substrate are as described above.

According to some embodiments of the present disclosure, in order to is further enhance the adhesion between the plasma coating and the substrate, the substrate is pretreated by a continuous wave plasma. Specifically, in an inert gas atmosphere, a plasma discharge is turned on, and the plasma discharge power ranges from 50 W to 500 W, and specifically may be such as 50 W, 100 W, 150 W, 200 W, 250 W, 300 W, 350 W, 400 W, 450 W, or 500 W. A discharge duration time ranges from 30 s to 600 s, and specifically may be such as 30 s, 50 s, 100 s, 200 s, 300 s, 400 s, 500 s, or 600 s. According to some other embodiments, the substrate is pretreated by heat, oxygen, or high-energy radiation, etc.

According to some embodiments of the present disclosure, the plasma is a pulse plasma. A flow rate of the monomer ranges from 50 μL/min to 500 L/min, and specifically may be such as 100 μL/min, 200 μL/min, 300 μL/min, or 400 μL/min. A vaporization temperature of the monomer ranges from 50° C. to 120° C., and specifically may be such as 50° C., 60° C., 70° C., 80° C., 90° C., 100° C., 110° C., or 120° C. The vaporization occurs under vacuum conditions, and the pulse plasma is generated by applying a pulse voltage discharge. The pulse power ranges from 50 W to 500 W, and specifically may be such as 50 W, 100 W, 150 W, 200 W, 250 W, 300 W, 350 W, 400 W, 450 W, or 500 W. A pulse frequency ranges from 25 Hz to 85 kHz, and specifically may be such as 25 Hz, 30 Hz, 35 Hz, 40 Hz, 45 Hz, 50 Hz, 55 Hz, 60 Hz, 65 Hz, 70 Hz, 75 Hz, 80 Hz, or 85 Hz. A pulse duty cycle ranges from 5% to 85%, and specifically may be such as 5%, 10%, 15%, 20%, 25%, 30%, 35%, 40%, 45%, 50%, 55%, 6(0%, 65%, 70%, 75%, 80% or 85%. A plasma discharge duration time ranges from 100 s to 36000 s, and specifically may be such as 100 s, 200 s, 500 s, 1000 s, 2000 s, 3000 s, 4000 s, 5000 s, 6000 s, 7000 s, 8000 s, 9000 s, 10000 s, 15000 s, 20000 s, 25000 s, 30000 s, 36000 s.

According to some embodiments of the present disclosure, the plasma discharge methods may be various conventional discharge methods, for example, electrodeless discharge (e.g., radio frequency inductively coupled discharge, microwave discharge), single-electrode discharge (e.g., corona discharge, plasma jet formed by single-electrode discharge), two-electrode discharge (e.g., dielectric barrier discharge, exposed electrode radio frequency glow discharge) and multi-electrode discharge (e.g., discharge using a floating electrode as a third electrode).

A device is also provided by some embodiments of the present disclosure. At least part of the surface of the device is provided with any one of the aforementioned composite coatings. According to some embodiments, the aforementioned protective coating is formed on part of or all of the surface of the device.

The present disclosure is further described in the following specific embodiments.

Embodiments

Description of Test Methods

The 20.5V underwater power-on test: the test process was as follows: 1, a 20.5V voltage was provided for circuit boards by a power supply; 2, the circuit boards were soaked in water; 3, the current was detected by a computer; 4, the failure time (current >0.6 mA) was recorded.

Salt spray test: the test was performed according to GB/T 2423.18-2000 environmental test method for electrical and electronic products.

Coating thickness test: an American Filmetrics F20-UV film thickness measuring instrument was used for testing.

Electrochemical test: a Shanghai Chenhua CHI660E C20704 electrochemical analyzer was used for testing a polarization curve in a 3.6% NaCl neutral solution. Test conditions included: a corrosion potential ranged from −600 mv to +600 mv, a scanning rate was 0.00033 mv/s, and the scanning duration time was 600 s.

Embodiment 1

A circuit board, a Mg sheet and a Fe sheet were placed in a plasma chamber, the chamber was vacuumized to 40 mTorr, and helium gas was introduced at a flow rate of 60 sccm. A radio frequency plasma discharge was turned on to pretreat the substrates, the discharge power in this pretreatment stage was 150 W, and the discharge duration time was 600 s.

Thereafter, a mixture of a monomer of 1,4-butanediol diacrylate and a monomer of tetrahydrofurfuryl acrylate (the mass ratio was 2:1) was introduced and vaporized at a vaporization temperature of 100° C. and then was introduced into the chamber for plasma chemical vapor deposition. The flow rate of the mixture was 150 μL/min. Plasmas in the chamber were generated by a radio frequency discharge, and the output mode was pulse. The discharge power was 50 W, the frequency was 45 Hz, the pulse duty cycle was 25%, and the discharge duration time was 3600 s.

Thereafter, a mixture of a monomer of 1,6-hexanediol diacrylate and a monomer of phenyl methacrylate (the mass ratio was 1:1) was introduced and vaporized at a vaporization temperature of 120° C. and then was introduced into the chamber for plasma chemical vapor deposition. The flow rate of the mixture was 100 μL/min. Plasmas in the chamber were generated by a radio frequency discharge, and the output mode was pulse. The discharge power was 20 W, the frequency was 25 Hz, the pulse duty cycle was 65%, and the discharge duration time was 7200 s.

Thereafter, a monomer of 3-(perfluoro-5-methylhexyl)-2-hydroxypropyl methacrylate was introduced and vaporized at a vaporization temperature of 120° C. and then was introduced into the chamber for plasma chemical vapor deposition. The flow rate of the monomer was 100 μL/min. Plasmas in the chamber were generated by a radio frequency discharge, and the output mode was pulse. The discharge power was 180 W, the frequency was 35 Hz, the pulse duty cycle was 45%, and the discharge duration time was 7200 s.

After coating, the compressed air was introduced to restore the chamber to normal pressure. The circuit board was taken out for the 20.5 V underwater power-on test. The Mg sheet and the Fe sheet were taken out for the salt spray test. The test results are listed in Table 1.

Embodiment 2

A circuit board, a Mg sheet and a Fe sheet were placed in a plasma chamber, the chamber was vacuumized to 8 mTorr, and helium gas was introduced at a flow rate is of 80 sccm. A radio frequency plasma discharge was turned on to pretreat the substrates, the discharge power in this pretreatment stage was 180 W, and the discharge duration time was 300 s.

Thereafter, a mixture of a monomer of triethylene glycol dimethacrylate and a monomer of glycidyl methacrylate (the mass ratio was 2:1) was introduced and vaporized at a vaporization temperature of 180° C. and then was introduced into the chamber for plasma chemical vapor deposition. The flow rate of the mixture was 10 μL/min. Plasmas in the chamber were generated by a radio frequency discharge, and the output mode was pulse. The discharge power was 50 W, the frequency was 45 Hz, the pulse duty cycle was 45%, and the discharge duration time was 3000 s.

Thereafter, a mixture of a monomer of 1,3-butanediol dimethacrylate and a monomer of 2-phenoxyethyl acrylate (the mass ratio was 1:2) was introduced and vaporized at a vaporization temperature of 180° C. and then was introduced into the chamber for plasma chemical vapor deposition. The flow rate of the mixture was 250 μL/min. Plasmas in the chamber were generated by a radio frequency discharge, and the output mode was pulse. The discharge power was 26 W, the frequency was 85 Hz, the pulse duty cycle was 25%, and the discharge duration time was 7200 s.

Thereafter, a monomer of 2-(perfluorohexyl) ethyl methacrylate was introduced and vaporized at a vaporization temperature of 120° C. and then was introduced into the chamber for plasma chemical vapor deposition. The flow rate of the monomer was 100 μL/min. Plasmas in the chamber were generated by a radio frequency discharge, and the output mode was pulse. The discharge power was 90 W, is the frequency was 65 Hz, the pulse duty cycle was 65%, and the discharge duration time was 1800 s.

After coating, the compressed air was introduced to restore the chamber to normal pressure. The circuit board was taken out for the 20.5 V underwater power-on test. The Mg sheet and the Fe sheet were taken out for the salt spray test. The test results are listed in Table 1.

Embodiment 3

A circuit board, a Mg sheet and a Fe sheet were placed in a plasma chamber, the chamber was vacuumized to 80 mTorr, and helium gas was introduced at a flow rate of 160 sccm. A radio frequency plasma discharge was turned on to pretreat the substrates, the discharge power in this pretreatment stage was 180 W, and the discharge duration time was 300 s.

Thereafter, a mixture of a monomer of 1,6-hexanediol diacrylate and a monomer of 3,4-epoxycyclohexylmethacrylate (the mass ratio was 2:1) was introduced and vaporized at a vaporization temperature of 180° C. and then was introduced into the chamber for plasma chemical vapor deposition. The flow rate of the mixture was 200ρL/min. Plasmas in the chamber were generated by a radio frequency discharge, and the output mode was pulse. The discharge power was 50 W, the frequency was 50 Hz, the pulse duty cycle was 45%, and the discharge duration time was 2400 s.

Thereafter, a mixture of a monomer of 1,6-hexanediol diacrylate and a is monomer of phenyl acrylate (the mass ratio was 3:2) was introduced and vaporized at a vaporization temperature of 180° C. and then was introduced into the chamber for plasma chemical vapor deposition. The flow rate of the mixture was 280 μL/min. Plasmas in the chamber were generated by a radio frequency discharge, and the output mode was pulse. The discharge power was 20 W, the frequency was 50 Hz, the pulse duty cycle was 15%, and the discharge duration time was 3000 s.

Thereafter, a monomer of 2-(perfluorohexyl) ethyl methacrylate was introduced and vaporized at a vaporization temperature of 120° C. and then was introduced into the chamber for plasma chemical vapor deposition. The flow rate of the monomer was 160 μL/min. Plasmas in the chamber were generated by a radio frequency discharge, and the output mode was pulse. The discharge power was 180 W, the frequency was 50 Hz, the pulse duty cycle was 15%, and the discharge duration time was 2600 s.

After coating, the compressed air was introduced to restore the chamber to normal pressure. The circuit board was taken out for the 20.5 V underwater power-on test. The Mg sheet and the Fe sheet were taken out for the salt spray test. The test results are listed in Table 1. The electrochemical test was conducted on a coated Mg sheet and an uncoated Mg sheet, a Tafel curve was obtained and is shown in FIG. 1, and the electrochemical parameter results obtained by fitting this curve are listed in Table 2.

Embodiment 4

A circuit board, a Mg sheet and a Fe sheet were placed in a plasma chamber, the chamber was vacuumized to 80 mTorr, and helium gas was introduced at a flow is rate of 120 sccm. A radio frequency plasma discharge was turned on to pretreat the substrates, the discharge power in this pretreatment stage was 500 W, and the discharge duration time was 300 s.

Thereafter, a mixture of a monomer of neopentyl glycol dimethacrylate and a monomer of 3,4-epoxycyclohexylmethyl-3,4-epoxycyclohexylcarboxylate (the mass ratio was 2:1) was introduced and vaporized at a vaporization temperature of 160° C. and then was introduced into the chamber for plasma chemical vapor deposition. The flow rate of the mixture was 300 μL/min. Plasmas in the chamber were generated by a radio frequency discharge, and the output mode was pulse. The discharge power was 80 W, the frequency was 25 Hz, the pulse duty cycle was 50%, and the discharge duration time was 3600 s.

Thereafter, a mixture of a monomer of neopentyl glycol dimethacrylate and a monomer of diallyl terephthalate (the mass ratio was 2.1) was introduced and vaporized at a vaporization temperature of 180° C. and then was introduced into the chamber for plasma chemical vapor deposition. The flow rate of the mixture was 400 μL/min. Plasmas in the chamber were generated by a radio frequency discharge, and the output mode was pulse. The discharge power was 100 W, the frequency was to 45 Hz, the pulse duty cycle was 45%, and the discharge duration time was 3600 s.

Thereafter, a monomer of 2-(perfluorododecyl) ethyl acrylate was introduced and vaporized at a vaporization temperature of 130° C. and then was introduced into the chamber for plasma chemical vapor deposition. The flow rate of the monomer was 150 μL/min. Plasmas in the chamber were generated by a radio is frequency discharge, and the output mode was pulse. The discharge power was 150 W, the frequency was 35 Hz, the pulse duty cycle was 50%, and the discharge duration time was 5400 s.

After coating, the compressed air was introduced to restore the chamber to normal pressure. The circuit board was taken out for the 20.5 V underwater power-on test. The Mg sheet and the Fe sheet were taken out for the salt spray test. The test results are listed in Table 1.

Comparative Embodiment 1

A circuit board, a Mg sheet and a Fe sheet were placed in a plasma chamber, the chamber was vacuumized to 80 mTorr, and helium gas was introduced at a flow rate of 160 sccm. A radio frequency plasma discharge was turned on to pretreat the substrates, the discharge power in this pretreatment stage was 180 W, and the discharge duration time was 300 s.

Thereafter, a mixture of a monomer of 1,6-hexanediol diacrylate and a monomer of phenyl acrylate (the mass ratio was 3:2) was introduced and vaporized at a vaporization temperature of 180° C. and then was introduced into the chamber for plasma chemical vapor deposition. The flow rate of the mixture was 280 μL/min. Plasmas in the chamber were generated by a radio frequency discharge, and the output mode was pulse. The discharge power was 20 W, the frequency was 50 Hz, the pulse duty cycle was 15%, and the discharge duration time was 5400 s.

Thereafter, a monomer of 2-(perfluorohexyl) ethyl methacrylate was introduced and vaporized at a vaporization temperature of 120° C. and then was is introduced into the chamber for plasma chemical vapor deposition. The flow rate of the monomer was 160 μL/min. Plasmas in the chamber were generated by a radio frequency discharge, and the output mode was pulse. The discharge power was 180 W, the frequency was 50 Hz, the pulse duty cycle was 15%, and the discharge duration time was 2600 s.

After coating, the compressed air was introduced to restore the chamber to normal pressure. The circuit board was taken out for the 20.5 V underwater power-on test. The Mg sheet and the Fe sheet were taken out for the salt spray test. The test results are listed in Table 1.

Comparative Embodiment 2

A circuit board, a Mg sheet and a Fe sheet were placed in a plasma chamber, the chamber was vacuumized to 40 mTorr, and helium gas was introduced at a flow rate of 60 sccm. A plasma discharge was turned on to pretreat the substrates, the discharge power in this pretreatment stage was 150 W, and the discharge duration time was 600 s.

Thereafter, a mixture of a monomer of 1,4-butanediol diacrylate and a monomer of tetrahydrofurfuryl acrylate (the mass ratio was 2:1) was introduced and vaporized at a vaporization temperature of 100° C. and then was introduced into the chamber for plasma chemical vapor deposition. The flow rate of the mixture was 150 μL/min. Plasmas in the chamber were generated by a radio frequency discharge, and the output mode was pulse. The discharge power was 50 W, the frequency was 45 Hz, the pulse duty cycle was 25%, and the discharge duration time was 3600 s.

Thereafter, a monomer of 1,6-hexanediol diacrylate was introduced and vaporized at a vaporization temperature of 120° C. and then was introduced into the chamber for plasma chemical vapor deposition. The flow rate of the monomer was 100 μL/min. Plasmas in the chamber were generated by a radio frequency discharge, and the output mode was pulse. The discharge power was 20 W, the frequency was 25 Hz, the pulse duty cycle was 65%, and the discharge duration time was 7200 s.

Thereafter, a monomer of 3-(perfluoro-5-methylhexyl)-2-hydroxypropyl methacrylate was introduced and vaporized at a vaporization temperature of 120° C. and then was introduced into the chamber for plasma chemical vapor deposition. The flow rate of the monomer was 100 μL/min. Plasmas in the chamber were generated by a radio frequency discharge, and the output mode was pulse. The discharge power was 180 W, the frequency was 35 Hz, the pulse duty cycle was 45%, and the discharge duration time was 7200 s.

After coating, the compressed air was introduced to restore the chamber to normal pressure. The circuit board was taken out for the 20.5 V underwater power-on test. The Mg sheet and the Fe sheet were taken out for the salt spray test. The test results are listed in Table 1.

TABLE 1

Performance Test Results of Embodiments 1-4 and Comparative Embodiments 1-2

Coating Performance Test

| Embodiment/ Comparative | 20.5 V Underwater Power-on Test | | | Salt Spray Test (5% NaCl solution) | | | | | |
|---|---|---|---|---|---|---|---|---|---|
| Embodiment | substrate | thickness (nm) | time | substrate | thickness (nm) | time | substrate | thickness (nm) | time |
| Embodiment 1 | circuit board | 255 | 5 h 52 min | Fe | 100 | 82 h | Mg | 137 | 56 h |
| Embodiment 2 | circuit board | 260 | 5 h 15 min | Fe | 125 | 84 h | Mg | 125 | 60 h |
| Embodiment 3 | circuit board | 273 | 6 h 15 min | Fe | 98 | 96 h | Mg | 100 | 72 h |
| Embodiment 4 | circuit board | 252 | 4 h 40 min | Fe | 108 | 74 h | Mg | 107 | 50 h |
| Comparative Embodiment 1 | circuit board | 264 | 3 h 20 min | Fe | 115 | 60 h | Mg | 105 | 38 h |
| Comparative Embodiment 2 | circuit board | 260 | 2 h 40 min | Fe | 105 | 42 h | Mg | 132 | 24 h |

TABLE 2

Electrochemical Parameter Test Results of Embodiments 3

| Embodiment | substrate | coating thickness (nm) | current density ($A/cm^2$) | corrosion potential (V) |
|---|---|---|---|---|
| Embodiment 3 | Mg | 100 | $1.876e^{-9}$ | −1.128 |
| | | 0 | $5.322e^{-5}$ | −1.385 |

From the performance test results of Embodiments 1-4 and Comparative Embodiments 1-2 in Table 1 above, it could be seen that Embodiments 1-4 have obvious advantages in the 20.5V underwater power-on test duration time and the salt spray test duration time compared with comparative Embodiments 1-2. The performance test results show that the composite coating of the present disclosure including a base coating and an anti-corrosion coating and being of an ultra-thin thickness has an excellent protective performance. The base coating was formed from to a plasma of the multifunctional-group ester-based monomer having an epoxy structure and a plasma of the ester-based coupling agent, and the anti-corrosion coating was formed from a plasma of an unsaturated ester-based monomer having aromatic ring(s) and a plasma of an ester-based coupling agent. In the meantime Embodiments 1-3 had longer duration time in the 20.5V underwater power-on test and the salt spray test compared with Embodiment 4, indicating that when the multifunctional-group ester having an epoxy structure in the base coating is an enolate ester structure, the composite coating has a better protective performance.

From the electrochemical parameters test results of Embodiment 3 in Table 2 above, it could be seen that, the uncoated Mg sheet in the 3.6% NaCl neutral solution had a very poor corrosion resistance, and an electrochemical corrosion occurred. The anodic reaction was a dissolution process of magnesium which lost electrons, and the cathodic reaction was a hydrogen evolution process from water which got electrons. It was found in the experiments that a corrosion potential of the uncoated Mg sheet was −1.385V, and a corrosion potential of the coated Mg sheet was −1.128V, indicating that the corrosion potential was reduced by 23% due to the coating, and the corrosion resistance was enhanced. A current density of the coated Mg sheet was $1.876e^{-9}$ $A/cm^2$. Compared with the uncoated Mg sheet, the current density of the coated Mg sheet was reduced by 4 orders of magnitude, indicating that the coated Mg sheet had an excellent protective performance.

Although the present disclosure has been disclosed above, the disclosure is not limited hereto. Those skilled in the art can modify and vary the embodiments without departing from the spirit and scope of the present disclosure. Therefore, the scope of protection of the present disclosure shall be subject to the scope defined in is claims.

What is claimed is:

1. A composite coating, comprising a coating I and a coating II deposited on a substrate, wherein the coating I is a plasma polymerization coating formed from plasmas comprising a monomer α and a monomer β;

wherein the coating II is a plasma polymerization coating formed on the coating I by contacting the coating I with plasmas comprising a monomer γ and a monomer δ;

wherein a structure of the monomer α is shown as in formula (1-1),

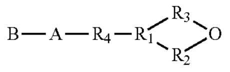

(1-1)

wherein $R_1$ is selected from CH or a $C_3$-$C_8$ cycloalkyl, $R_2$, $R_3$ and $R_4$ are respectively independently selected from a connecting bond or a $C_1$-$C_6$ alkylene, $R_2$ and $R_3$ are not connected to a same carbon atom when $R_2$ and $R_3$ are both connecting bonds, A is a connecting part, and B comprises a carbon-carbon unsaturated bond or an epoxy structure;

wherein a structure of the monomer β is shown as in formula (2-1),

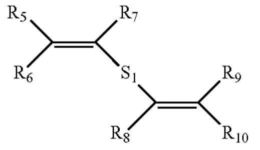

(2-1)

wherein $S_1$ comprises at least one —O—C(O)— or —C(O)—O—, and $R_5$, $R_6$, $R_7$, $R_8$, $R_9$ and $R_{10}$ are respectively independently selected from a group consisting of a hydrogen atom, a halogen atom, a $C_1$-$C_{10}$ alkyl and a halogen-substituted $C_1$-$C_{10}$ alkyl;

wherein a structure of the monomer γ is shown as in formula (3-1),

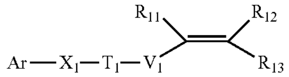

(3-1)

wherein Ar is a structure with aromatic ring(s), $T_1$ is —O—C(O)— or —C(O)—O—, $X_1$ is a connecting part, $Y_1$ is a connecting part, and $R_{11}$, $R_{12}$ and $R_{13}$ are respectively independently selected from a group consisting of a hydrogen atom, a halogen atom, a $C_1$-$C_{10}$ alkyl and a halogen-substituted $C_1$-$C_{10}$ alkyl; and wherein a structure of the monomer δ is shown as in formula (4-1),

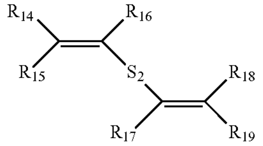

(4-1)

wherein $S_2$ comprises at least one —O—C(O)— or —C(O)—O—, and $R_{14}$, $R_{15}$, $R_{16}$, $R_{17}$, $R_{18}$ and $R_{19}$ are respectively independently selected from a group consisting of a hydrogen atom, a halogen atom, a $C_1$-$C_{10}$ alkyl and a halogen-substituted $C_1$-$C_{10}$ alkyl.

2. The composite coating according to claim 1, wherein the A is —O—C(O)— or —C(O)—O—.

3. The composite coating according to claim 2, wherein a structure of the monomer α is shown as in formula (1-2), (1-2)

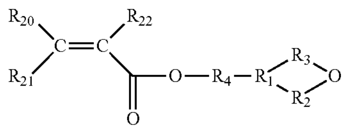

wherein $R_{20}$, $R_{21}$ and $R_{22}$ are respectively independently selected from a group consisting of a hydrogen atom, a halogen atom, a $C_1$-$C_{10}$ alkyl and a halogen-substituted $C_1$-$C_{10}$ alkyl.

4. The composite coating according to claim 3, wherein the $R_5$, $R_6$, $R_7$, $R_8$, $R_9$, $R_{10}$, $R_{11}$, $R_{12}$, $R_{13}$, $R_{14}$, $R_{15}$, $R_{16}$, $R_{17}$, $R_{18}$, $R_{19}$, $R_{20}$, $R_{21}$ and $R_{22}$ are respectively independently selected from a group consisting of a hydrogen atom and a methyl.

5. The composite coating according to claim 1, wherein the monomer α comprises one or more selected from a group consisting of: glycidyl methacrylate, tetrahydrofurfuryl acrylate, 3,4-epoxycyclohexylmethyl-3,4-epoxycyclohexylcarboxylate, 3,4-epoxycyclohexylmethacrylate, 3,4-epoxycyclohexylmethylmethacrylate, 1,2-epoxy-4-vinylcyclohexane, bis (2,3-epoxycyclopentyl) ether, 2,3-epoxycyclopentylcyclopentyl ether, vinylcyclohexene diepoxide, diisoprene diepoxide and bis ((3,4-epoxycyclohexyl) methyl) adipate.

6. The composite coating according to claim 1, wherein a structure of the $S_1$ is shown as in formula (2-2), (2-2)

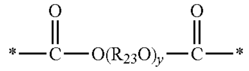

wherein $R_{23}$ is a $C_2$-$C_{10}$ alkylene or a halogen-substituted $C_2$-$C_{10}$ alkylene, and y is an integer ranging from 0 to 10;

a structure of the $X_1$ is shown as in formula (3-2), $$*—X_{11}—X_{12}—* \quad (3\text{-}2)$$

wherein $X_{11}$ is a connecting bond, —O— or —C(O)—, and $X_{12}$ is a connecting bond, a $C_1$-$C_{10}$ alkylene or a halogen-substituted $C_1$-$C_{10}$ alkylene;

the $Y_1$ is a connecting bond, a $C_1$-$C_{10}$ alkylene or a halogen-substituted $C_1$-$C_{10}$ alkylene; and a structure of the $S_2$ is shown as in formula (4-2), (4-2)

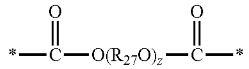

wherein $R_{27}$ is a $C_2$-$C_{10}$ alkylene or a halogen-substituted $C_2$-$C_{10}$ alkylene, and z is an integer ranging from 0 to 10.

7. The composite coating according to claim 1, wherein the monomer β comprises at least one selected from a group consisting of: 1,4-butanediol dimethacrylate, 1,6-hexanediol dimethacrylate, ethylene glycol dimethacrylate, diethylene glycol dimethacrylate, triethylene glycol dimethacrylate, tetraethylene glycol dimethacrylate, 1,3-butanediol dimethacrylate, neopentyl glycol dimethacrylate, methacrylic anhydride, diprop-2-enyl-2-methylene succinate, diprop-2-enyl 2-benzylidene malonate, and diethyl diallyl malonate.

8. The composite coating according to claim 1, wherein the Ar is a benzene ring structure or a benzene ring structure with substituent(s).

9. The composite coating according to claim 8, wherein a structure of the monomer γ is shown as in formula (3-3), (3-3)

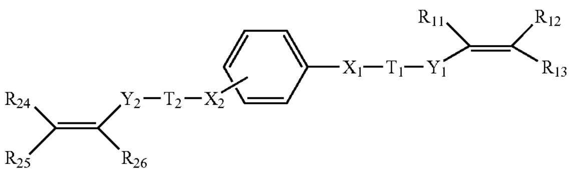

wherein $T_2$ is —O—C(O)— or —C(O)—O—, $X_2$ is a connecting part, $Y_2$ is a connecting part, and $R_{24}$, $R_{25}$ and $R_{26}$ are respectively independently selected from a group consisting of a hydrogen atom, a halogen atom, a $C_1$-$C_{10}$ alkyl and a halogen-substituted $C_1$-$C_{10}$ alkyl.

10. The composite coating according to claim 9, wherein a structure of the $X_2$ is shown as in formula (3-4), $$*—X_{22}—X_{21}—* \quad (3\text{-}4)$$

wherein $X_{21}$ is a connecting bond, —O— or —C(O)—, and $X_{22}$ is a connecting bond, a $C_1$-$C_{10}$ alkylene or a halogen-substituted $C_1$-$C_{10}$ alkylene; and the $Y_2$ is a connecting bond, a $C_1$-$C_{10}$ alkylene or a halogen-substituted $C_1$-$C_{10}$ alkylene.

11. The composite coating according to claim 1, wherein the monomer γ comprises at least one selected from a group consisting of: 2-phenoxyethyl acrylate, phenyl acrylate, diallyl terephthalate and phenyl methacrylate.

12. The composite coating according to claim 1, wherein the monomer δ comprises at least one selected from a group consisting of: 1,4-butanediol dimethacrylate, 1,6-hexanediol dimethacrylate, ethylene glycol dimethacrylate, diethylene glycol dimethacrylate, triethylene glycol dimethacrylate, tetraethylene glycol dimethacrylate, 1,3-butanediol dimethacrylate, neopentyl glycol dimethacrylate, methacrylic anhydride, dipropyl-2-allyl-2-methylene succinate, diprop-2-enyl 2-benzylidene malonate, and diethyl diallyl malonate.

13. The composite coating according to claim 1, further comprising a coating III, wherein the coating III is a plasma polymerization coating formed on the coating II by contacting the coating II with plasmas comprising a monomer ε; and a structure of the monomer ε is shown as in formula (5-1), (5-1)

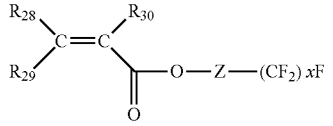

wherein Z is a connecting part, $R_{28}$, $R_{29}$ and $R_{30}$ are respectively independently selected from a group consisting of a hydrogen atom, a halogen atom, a $C_1$-$C_{10}$ hydrocarbyl and a halogen-substituted $C_1$-$C_{10}$ hydrocarbyl, and x is an integer ranging from 1 to 20.

14. The composite coating according to claim 13, wherein the Z is a connecting bond, a $C_1$-$C_4$ alkylene or a $C_1$-$C_4$ alkylene with substituent(s), and x is an integer greater than or equal to 5.

15. The composite coating according to claim 13, wherein the $R_{28}$, $R_{29}$ and $R_{30}$ are respectively independently selected from a group consisting of a hydrogen atom and a methyl.

16. The composite coating according to claim 13, wherein the monomer & comprises one or more selected from a group consisting of: 3-(perfluoro-5-methylhexyl)-2-hydroxypropyl methacrylate, 2-(perfluorodecyl) ethyl methacrylate, 2-(perfluorohexyl) ethyl methacrylate, 2-(perfluorododecyl) ethyl acrylate, 2-perfluorooctyl ethyl acrylate, 1H,1H,2H,2H-perfluorooctyl acrylate, 2-(perfluorobutyl) ethyl acrylate, (2H-perfluoropropyl)-2-acrylate, and (perfluorocyclohexyl) methacrylate.

17. The composite coating according to claim 1, wherein a thickness of the composite coating ranges from 50 nm to 300 nm.

18. The composite coating according to claim 1, wherein a molar ratio of the monomer $\alpha$ and the monomer $\beta$ ranges from 1:5 to 5:1; and a molar ratio of the monomer $\gamma$ and the monomer $\delta$ ranges from 3:10 to 10:3.

19. The composite coating according to claim 1, wherein the substrate is a metal, a plastic, a fabric, a glass, an electrical assembly, an optical instrument or an electrical component.

20. A device, wherein at least a part of a surface of the device is provided with the composite coating as claimed in claim 1.

* * * * *